(12) United States Patent
Hu et al.

(10) Patent No.: US 11,927,887 B2
(45) Date of Patent: Mar. 12, 2024

(54) OPC OPERATION METHOD AND OPC OPERATION DEVICE

(71) Applicant: UNITED MICROELECTRONICS CORP., Hsinchu (TW)

(72) Inventors: Guo-Xin Hu, Tainan (TW); Yuh-Kwei Chao, Kaohsiung (TW); Chung-Yi Chiu, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 433 days.

(21) Appl. No.: 17/348,806

(22) Filed: Jun. 16, 2021

(65) Prior Publication Data

US 2022/0365444 A1    Nov. 17, 2022

(30) Foreign Application Priority Data

May 17, 2021 (CN) .......................... 202110533878.1

(51) Int. Cl.
| | |
|---|---|
| *G03F 7/00* | (2006.01) |
| *G06F 18/214* | (2023.01) |
| *G06N 20/00* | (2019.01) |
| *G06T 7/00* | (2017.01) |
| *G06V 10/44* | (2022.01) |

(52) U.S. Cl.
CPC ........ *G03F 7/70441* (2013.01); *G06F 18/214* (2023.01); *G06N 20/00* (2019.01); *G06T 7/0004* (2013.01); *G06V 10/44* (2022.01); *G06T 2207/20081* (2013.01); *G06T 2207/30148* (2013.01)

(58) Field of Classification Search
CPC .... G03F 7/70441; G03F 1/36; G03F 7/70508; G06F 18/214; G06N 20/00; G06T 7/0004; G06T 2207/20081; G06T 2207/30148; G06T 7/0006; G06V 10/44
USPC ......................................................... 716/53
See application file for complete search history.

(56) References Cited

U.S. PATENT DOCUMENTS

| | | | |
|---|---|---|---|
| 9,690,898 B2 | 6/2017 | Graur et al. | |
| 9,846,934 B2 | 12/2017 | Zafar et al. | |
| 2019/0147134 A1* | 5/2019 | Wang ...................... | G06F 30/20 716/52 |
| 2022/0100935 A1* | 3/2022 | Chen ........................ | G06N 3/08 |
| 2023/0229845 A1* | 7/2023 | Ma ......................... | G06F 30/398 716/112 |

* cited by examiner

*Primary Examiner* — Paul Dinh
(74) *Attorney, Agent, or Firm* — WPAT. P.C.

(57) ABSTRACT

An optical proximity correction (OPC) operation method and an OPC operation device are provided. The OPC operation method includes the following steps. A mask layout is obtained. If the mask layout contains at least one defect hotspot, at least one partial area pattern is extracted from the mask layout according to the at least defect hotspot. A machine learning model is used to analyze the local area pattern to obtain at least one OPC strategy. The OPC strategy is implemented to correct the mask layout.

16 Claims, 9 Drawing Sheets

OPC OPERATION METHOD AND OPC OPERATION DEVICE

This application claims the benefit of People's Republic of China application Serial No. 202110533878.1, filed May 17, 2021, the subject matter of which is incorporated herein by reference.

BACKGROUND OF THE INVENTION

Field of the Invention

The invention relates in general to an operation method and operation device, and more particularly to an optical proximity correction (OPC) operation method and an OPC operation device.

Description of the Related Art

Photolithography is an important step in the semiconductor process. During photolithography, predetermined photoresist pattern is developed on the photoresist layer by defining exposure region and non-exposure region on the mask pattern of the mask. During the etching process, traces can be etched using the photoresist pattern. However, if the etched traces contain defects, caused by such as disconnection or short-circuiting, the mask pattern needs to be corrected using optical proximity correction (OPC). The purpose of OPC is to make the etched traces consistent with the predetermined circuit pattern and be free of defects.

However, different defects and different patterns may require different OPC strategies. Conventionally, the determination of the OPC strategies relies on the operator's judgement, not only easily resulting in an erroneous judgement but also making it difficult to accumulate the experiences.

SUMMARY OF THE INVENTION

The invention is directed to an optical proximity correction (OPC) operation method and an OPC operation device. Facing various mask patterns, the OPC operation method and operation device of the invention are capable of analyzing one or more local area patterns to obtain one or more corresponding OPC strategies using a machine learning model without relying on the operator's judgement, not only making the judgement more accurate but also accumulating the experiences.

According to one embodiment of the present invention, an optical proximity correction (OPC) operation method is provided. The OPC operation method includes the following steps. A mask layout is obtained. If the mask layout contains at least one defect hotspot, at least one partial area pattern is extracted from the mask layout according to the at least defect hotspot. A machine learning model is used to analyze the local area pattern to obtain at least one OPC strategy. The OPC strategy is implemented to correct the mask layout.

According to another embodiment of the present invention, an optical proximity correction (OPC) operation device is provided. The OPC operation device includes an input unit, a local area extraction unit, a machine learning model and a correction unit. The input unit is used to obtain a mask layout. If the mask layout contains at least one defect hotspot, the local area extraction unit extracts at least one local area pattern according to the defect hotspot. The machine learning model is used to analyze the local area pattern to obtain at least one OPC strategy. The correction unit is used to implement the OPC strategy to correct the mask layout.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
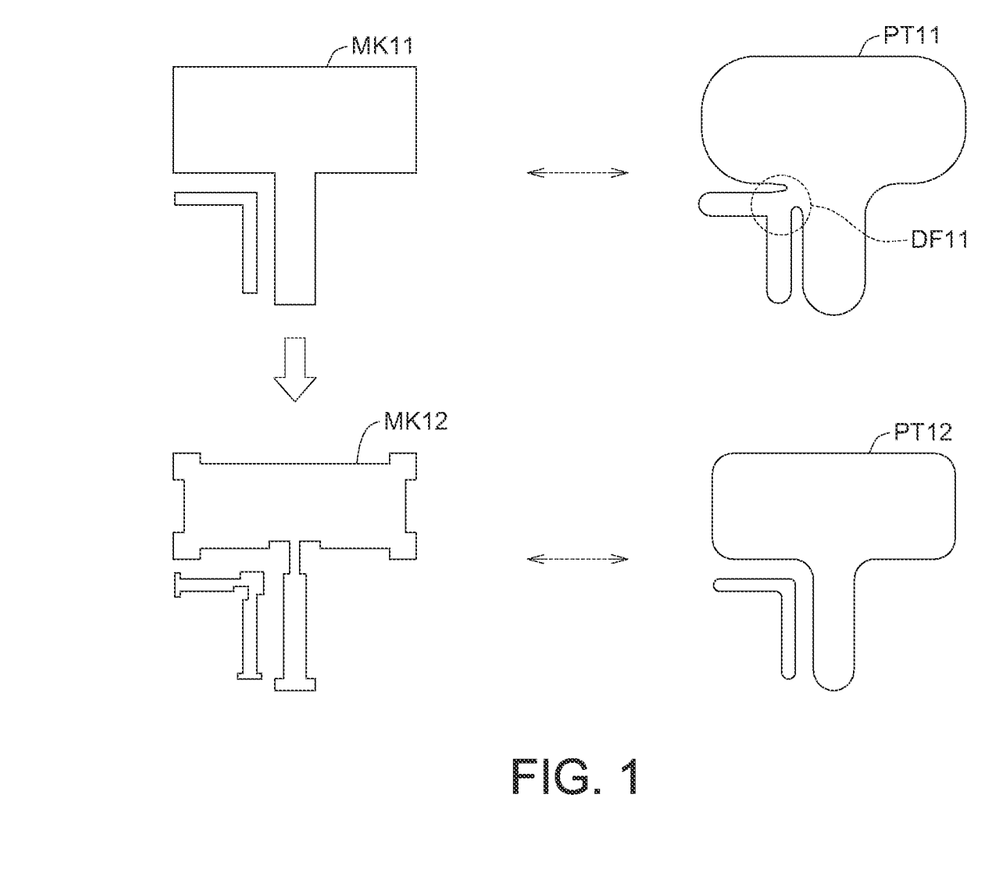
FIG. 1 is a schematic diagram of an OPC according to an embodiment.

Referring to FIG. 1, a schematic diagram of an OPC according to an embodiment is shown. The OPC technology mainly is for correcting the mask pattern. The purpose of OPC is for making the etched traces consistent with the predetermined circuit pattern and free of defects. As indicated in FIG. 1, after the exposing process, the developing process and the etching process are performed using the mask pattern MK11, a circuit pattern PT11 can be obtained. A defect hotspot DF11 caused by bridging can be found on the circuit pattern PT11.

To avoid the defect hotspot DF11, the research personnel corrects the mask pattern MK11 as a mask pattern MK12 using a particular OPC strategy. As indicated in FIG. 1, after the exposing process, the developing process and the etching process are performed using the mask pattern MK12, a circuit pattern PT12 can be obtained. The circuit pattern PT12 no longer contains the defect hotspot DF11. However, the defect hotspot has many implementations, and both the density and the curvature of the traces affect the circuit pattern. Therefore, with respect to various situations, it is difficult to determine which OPC strategy is most suitable.

Figure 2:
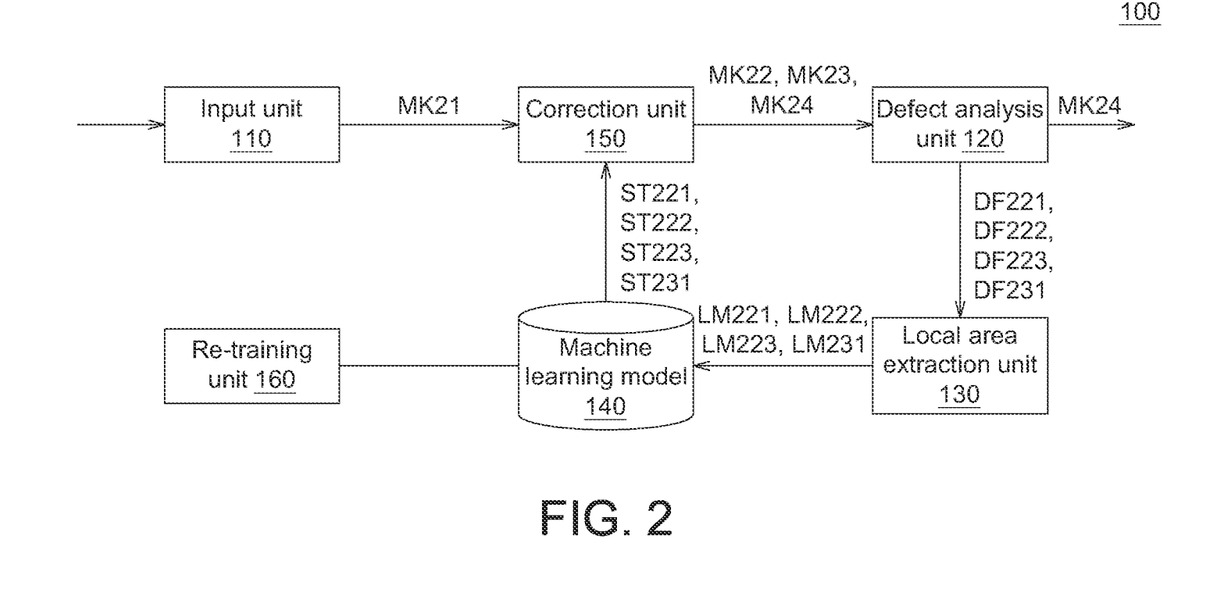
FIG. 2 is a schematic diagram of an OPC operation device according to an embodiment.

Referring to FIG. 2, a schematic diagram of an OPC operation device 100 according to an embodiment is shown. The OPC operation device 100 includes an input unit 110, a defect analysis unit 120, a local area extraction unit 130, a machine learning model 140, a correction unit 150 and a re-training unit 160. Detailed descriptions of the function of each element are disclosed below. The input unit 110 is used to input data. The defect analysis unit 120 is used to perform a defect analysis. The local area extraction unit 130 is used to divide local area patterns. The machine learning model 140 is used to perform an image analysis or a recognition procedure. The correction unit 150 is used to perform an OPC. The re-training unit 160 is used to re-train the machine learning model 140. The input unit 110 can be realized by a database, a transmission line, a network cable or a wireless transmission module. The defect analysis unit 120, the local area extraction unit 130, the machine learning model 140, the correction unit 150 and/or the re-training unit 160 can be realized by a circuit, a chip, a circuit board, a code, or a storage device for storing programming codes. During the operation of the OPC operation device 100, the machine learning model 140 can analyze at least one local area pattern to obtain at least one OPC strategy. Detailed operations of each element are disclosed below with an accompanying flowchart.

Figure 3:
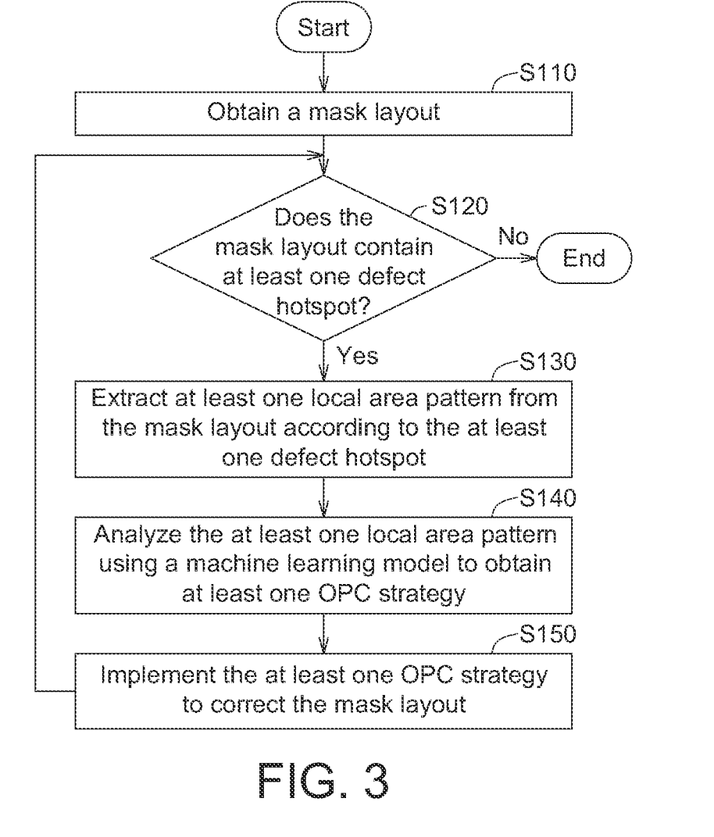
FIG. 3 is a flowchart of an OPC operation method according to an embodiment.
Figure 4:
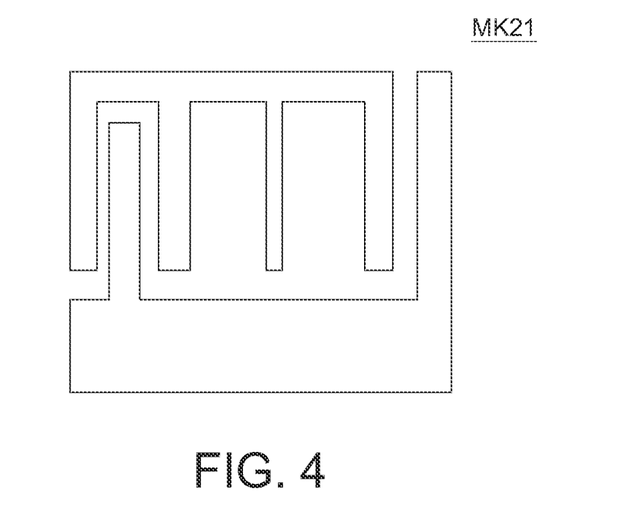
FIGS. 4 to 9 illustrate each step of FIG. 3.

Refer to FIGS. 3 to 9. FIG. 3 is a flowchart of an OPC operation method according to an embodiment. FIGS. 4 to 9 illustrate steps S110 to S150 of FIG. 3. In step S110 as indicated in FIG. 4, a mask layout MK21 is obtained by the input unit 110, wherein the mask layout MK21 can be a GDS file. Before correction, the mask layout MK21 has even edges. According to the descriptions of FIG. 1, the uncorrected mask layout MK21 may generate defect hotspots caused by such as short-circuiting, disconnection or bridging. Therefore, the correction unit 150 can perform a thorough correction on the mask layout MK21 using a basic OPC strategy to obtain a mask layout MK22 of FIG. 5.

Figure 5:
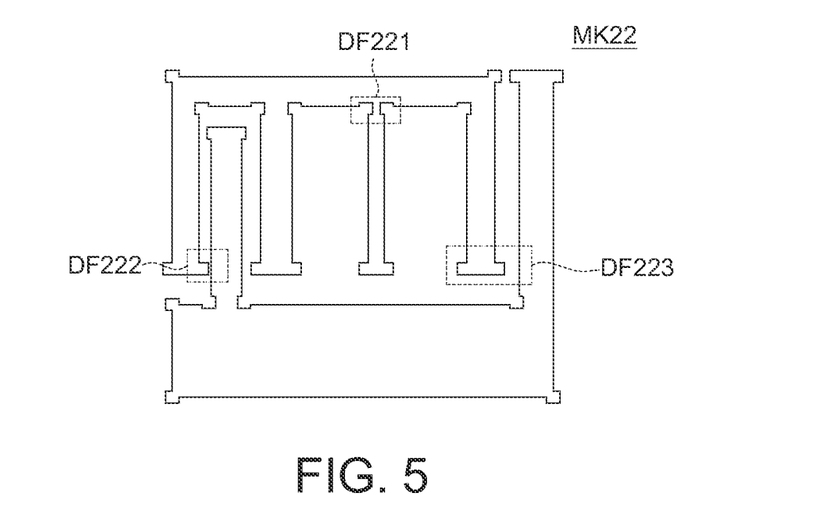

Then, the method proceeds to step S120 as indicated in FIG. 5, whether the mask layout MK22 contains any defect hotspots is determined by the defect analysis unit 120. If the mask layout MK22 does not contain any defect hotspots, then the method terminates. If the mask layout MK22 contains some defect hotspots, then the method proceeds to S130. The mask layout MK22 may contain one or more defect hotspots. As indicated in FIG. 5, the mask layout MK22 contains three defect hotspots DF221, DF222 and DF223. For example, the defect hotspot DF221 is caused by disconnection, and the defect hotspot DF222 and the defect hotspot DF223 are caused by bridging.

Figure 6:
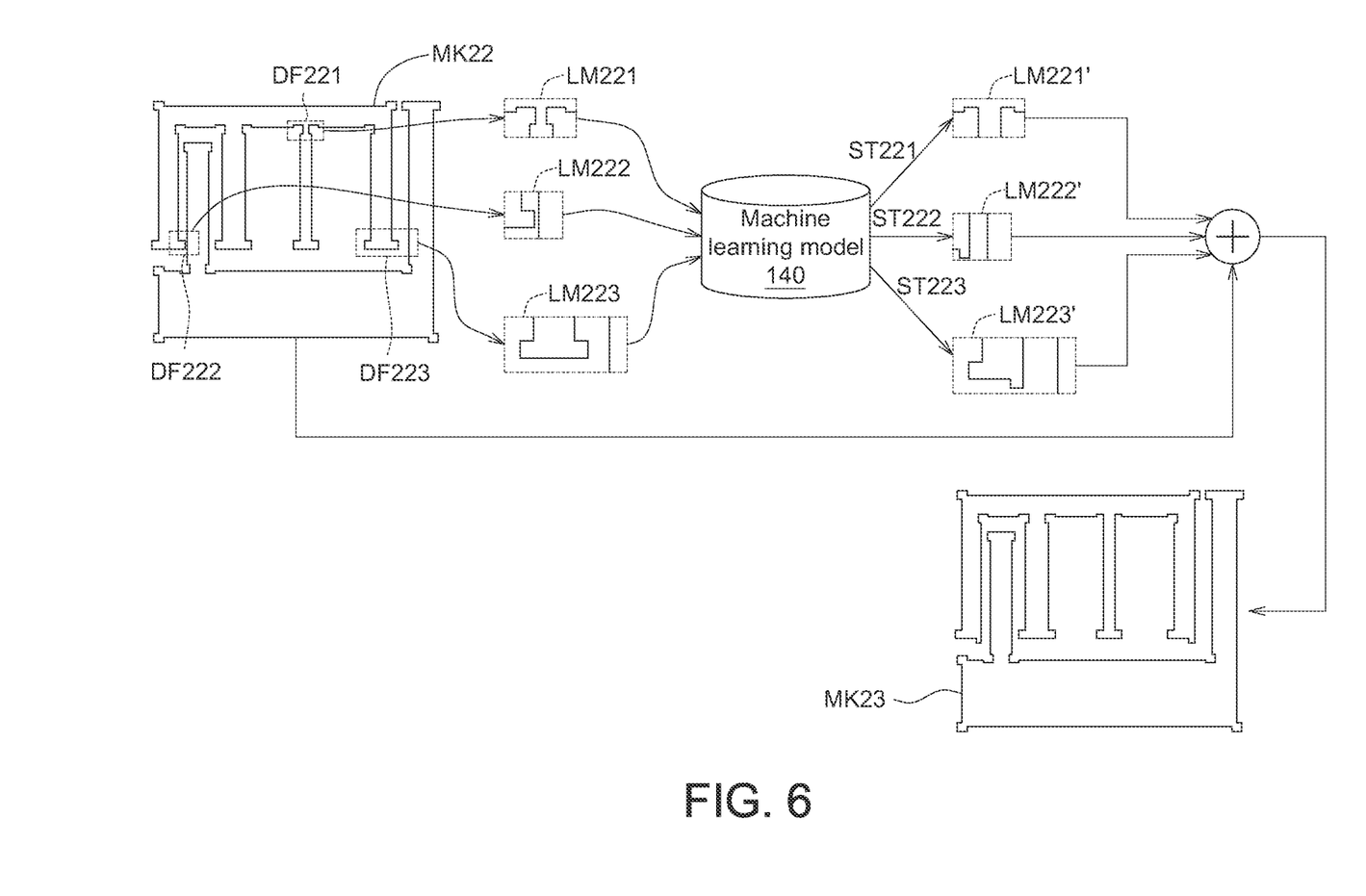

In step S130 as indicated in FIG. 6, local area patterns LM221, LM222 and LM223 are extracted by the local area extraction unit 130 according to the defect hotspots DF221, DF222 and DF223. The local area patterns LM221, LM222 and LM223 are adjacent areas of the defect hotspots DF221, DF222 and DF223; they do not form the entire mask layout MK22. The sizes of the local area patterns LM221, LM222 and LM223 can be identical or different. The sizes of the local area patterns LM221, LM222 and LM223 can be 5 to 20 times of the line width.

Then, the method proceeds to step S140 as indicated in FIG. 6, the local area patterns LM221, LM222 and LM223 are analyzed by the machine learning model 140 to obtain OPC strategies ST221, ST222 and ST223. The OPC strategy ST221 is used to correct the local area pattern LM221 to avoid the occurrence of disconnection. The OPC strategies ST222 are ST223 are used to correct local area patterns LM222 and LM223 to avoid the occurrence of bridging. The OPC strategies ST221, ST222 and ST223 can be completely identical, completely different or partly identical. Besides, with respect to the same local area pattern, the machine learning model 140 can analyze several OPC strategies from which an optimum OPC strategy can be determined using a cost analysis method.

Then, the method proceeds to step S150 as indicated in FIG. 6, the OPC strategies ST221, ST222 and ST223 are implemented by the correction unit 150 to correct the mask layout MK22. In the present step, the OPC strategies ST221, ST222 and ST223 are implemented by the correction unit 150 on the local area patterns LM221, LM222 and LM223 to obtain corrected local area patterns LM221', LM222' and LM223'. The correction unit 150 further merges the corrected local area patterns LM221', LM222' and LM223' to the mask layout MK22 to obtain a mask pattern LM23 of FIG. 7. In the present step, the OPC strategies ST221, ST222 and ST223 can be concurrently or sequentially implemented.

In another embodiment, the process of merging the corrected local area patterns LM221', LM222' and LM223' to the mask layout MK22 can be omitted, and the OPC strategies ST221, ST222 and ST223 can be sequentially and directly implemented on the entire mask layout MK22.

Figure 7:
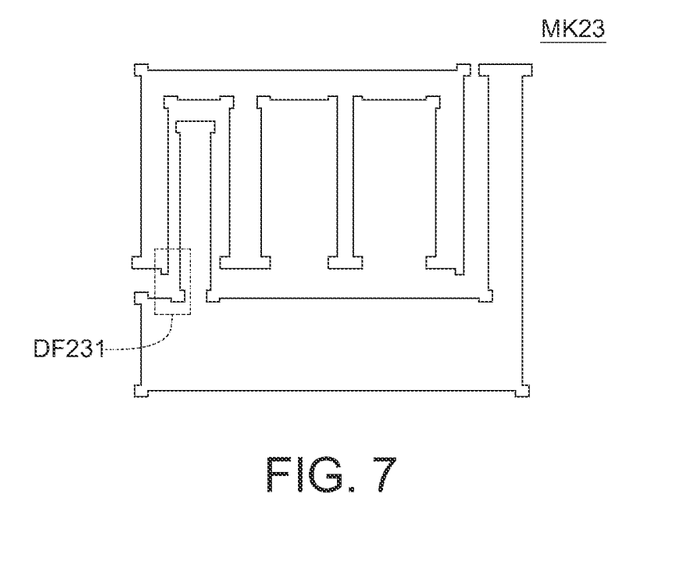

Then, the method returns to step S120. In step S120 as indicated in FIG. 7, whether the mask layout MK23 contains any defect hotspots is determined by the defect analysis unit 120. If the mask layout MK23 does not contain any defect hotspots, then the method terminates. If the mask layout MK23 contains some defect hotspots, then the method proceeds to S130. As indicated in FIG. 7, the mask layout MK23 contains a defect hotspot DF231 corresponding to the corrected local area pattern LM222'. That is, the mask layout MK23 still needs to be corrected.

Figure 8:
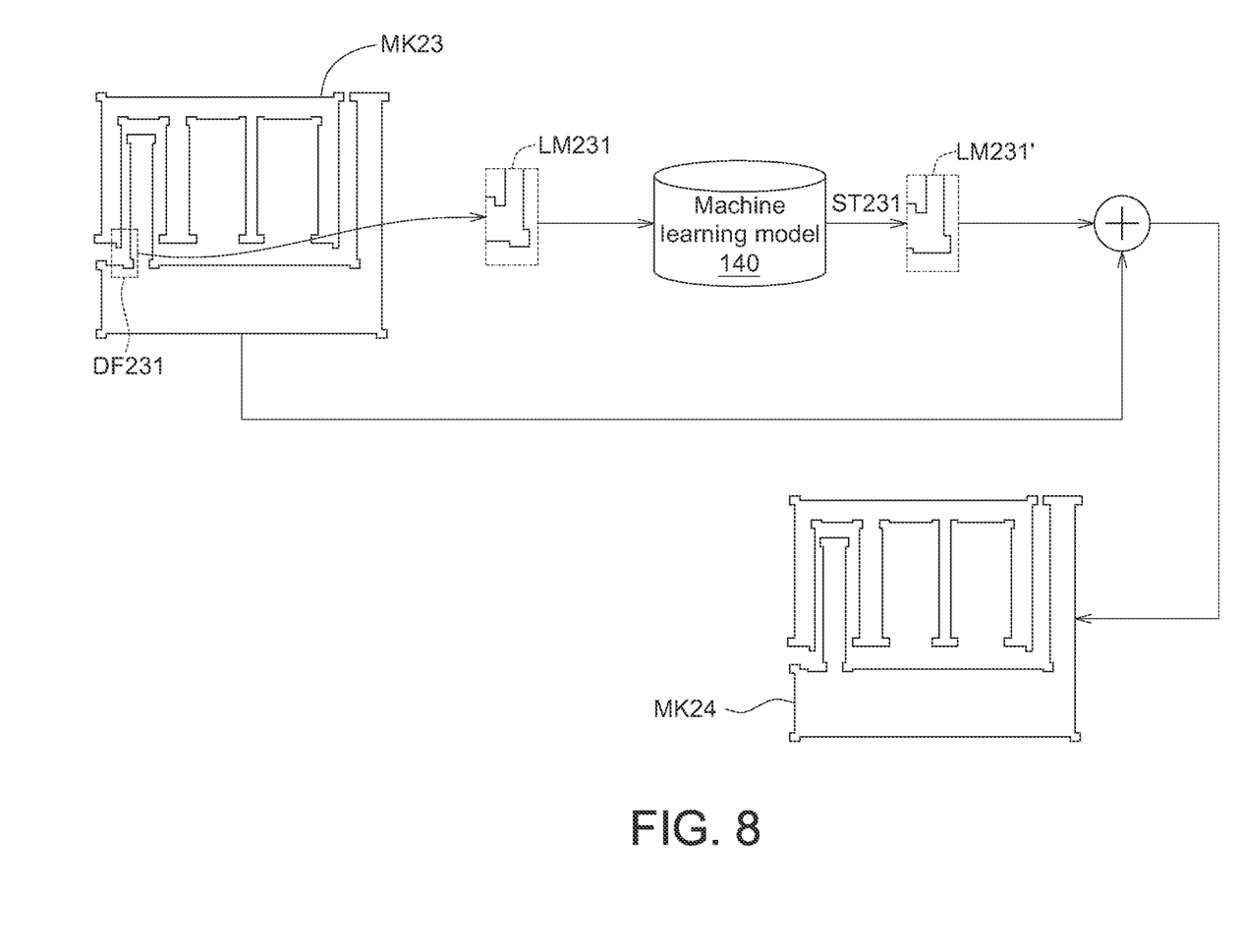

In step S130 as indicated in FIG. 8, the local area pattern LM231 is extracted by the local area extraction unit 130 according to the defect hotspot DF2.

Then, the method proceeds to step S140 as indicated in FIG. 8, the local area pattern LM231 is analyzed by the machine learning model 140 to obtain an OPC strategy ST231.

Then, the method proceeds to step S150 as indicated in FIG. 8, the OPC strategy ST231 is implemented by the correction unit 150 to correct the mask layout MK23. In the present step, the correction unit 150 implements the OPC strategy ST231 on the local area pattern LM231 to obtain a corrected local area pattern LM231'. The correction unit 150 further merges the corrected local area pattern LM231' to the mask layout LM23 to obtain the mask layout MK24 of FIG. 9.

Figure 9:
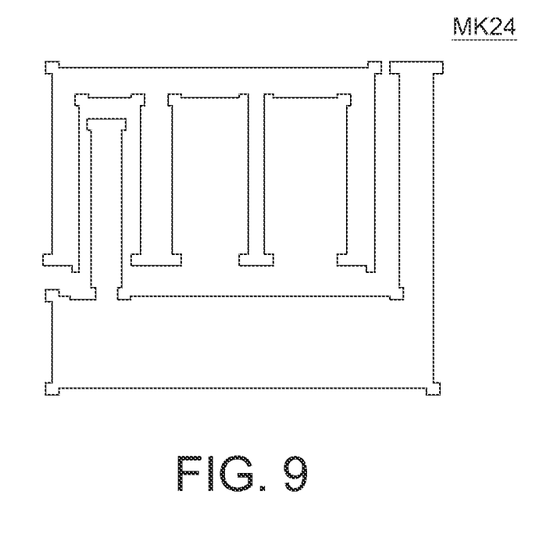

Then, the method returns to step S120. In step S120 as indicated in FIG. 9, whether the mask layout MK24 contains any defect hotspots is determined by the defect analysis unit 120. If the mask layout MK24 does not contain any defect hotspots, then the method terminates. If the mask layout MK24 contains some defect hotspots, then the method proceeds to S130. As indicated in FIG. 9, the mask layout MK24 does not contain any defect hotspots, therefore the method terminates.

According to above embodiments, with respect to various mask patterns, the machine learning model 140 can analyze one or more local area patterns to obtain one or more corresponding OPC strategies instead of determining the OPC strategies according to the operator's judgement, such that the determination of OPC strategies is more accurate and the experiences can be accumulated. Details of accumulating the experiences to re-train the machine learning model 140 are disclosed below.

Figure 10:
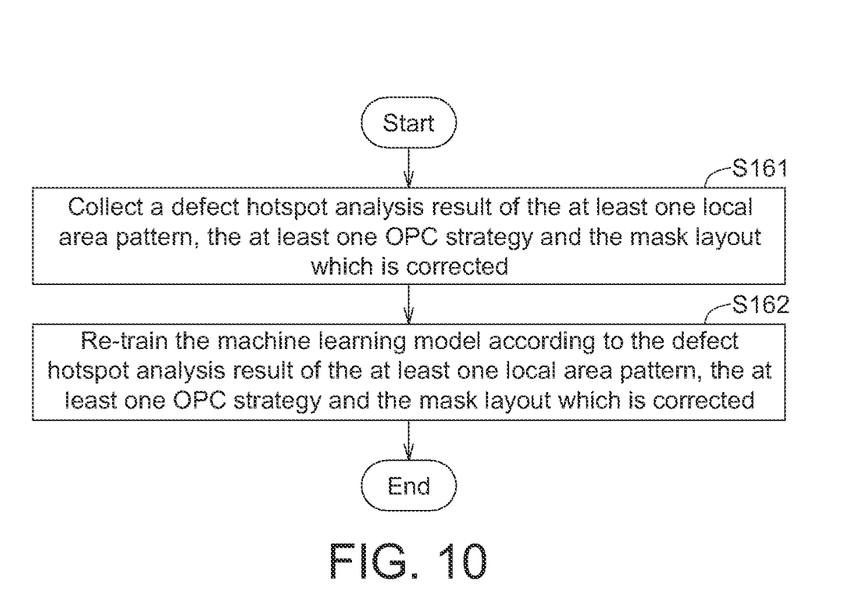
FIG. 10 is a flowchart of a re-training method of a machine learning model according to an embodiment.
Figure 11:
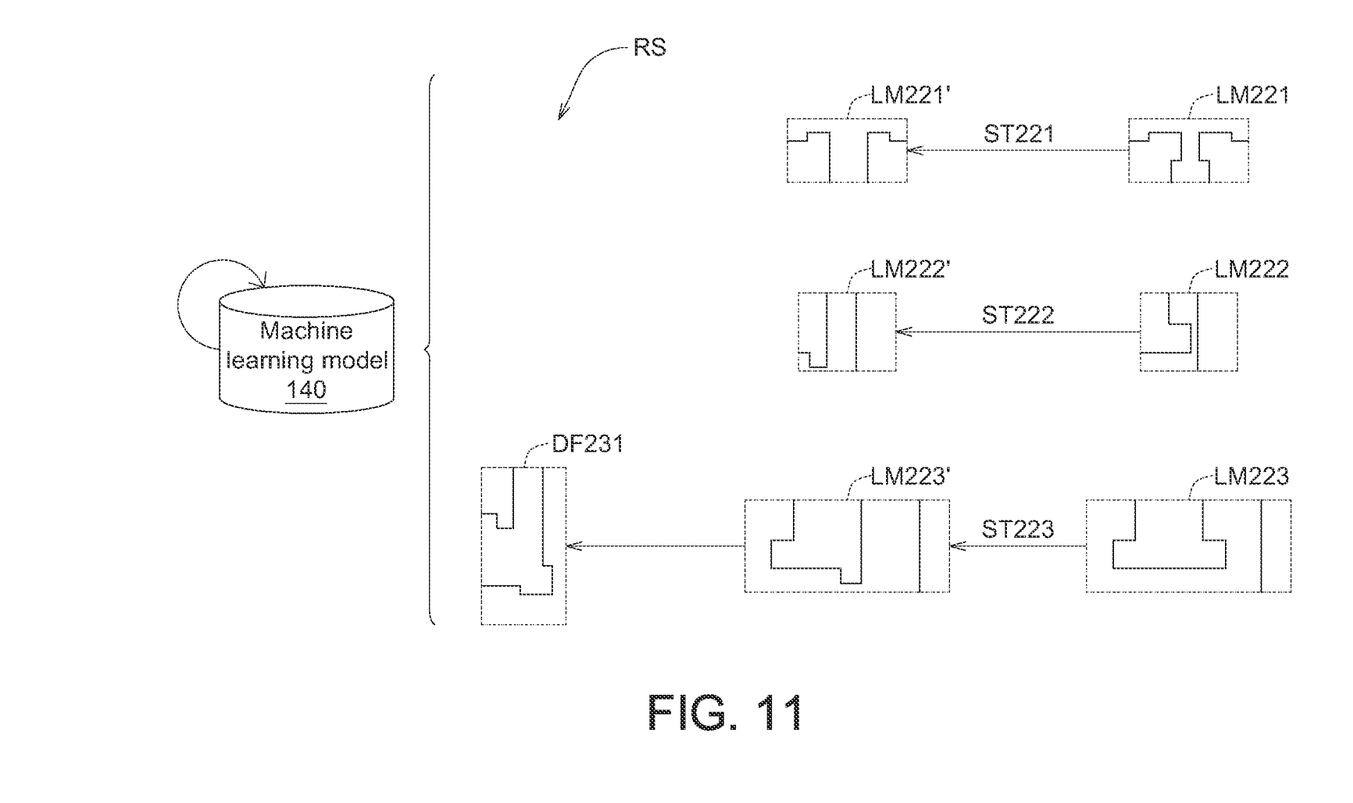
FIG. 11 illustrate each step of FIG. 10.

Refer to FIGS. 10 to 11. FIG. 10 is a flowchart of a re-training method of a machine learning model 140 according to an embodiment. FIG. 11 illustrate each step of FIG. 10. In step S161, a defect hotspot analysis result RS of the local area patterns LM221, LM222 and LM223, the OPC strategies ST221, ST222 and ST223 and the corrected local area patterns LM221', LM222' and LM223' is collected. In step S162, the machine learning model 140 is re-trained by the re-training unit 160 according to the defect hotspot analysis result RS of the local area patterns LM221, LM222 and LM223, the OPC strategies ST221, ST222 and ST223 and the corrected local area patterns LM221', LM222' and LM223'. For example, the local area patterns LM221' and LM222' do not contain any defect hotspots, but the local area pattern LM223' contains the defect hotspot DF231. The defect hotspot analysis result RS is the ground truth of the training data. The machine learning model 140 can be re-trained using these data to accumulate experiences and increase the accuracy of analysis.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An optical proximity correction (OPC) operation method, comprising:
    obtaining a mask layout;
    if the mask layout contains at least one defect hotspot, extracting at least one local area pattern from the mask layout according to the at least one defect hotspot;
    analyzing the at least one local area pattern using a machine learning model to obtain more than one OPC strategies and determining an optimum OPC strategy among the more than one OPC strategies by using a cost analysis method; and
    implementing the optimum OPC strategy to correct the mask layout.

2. The OPC operation method according to claim 1, wherein a quantity of the at least one local area pattern extracted from the mask layout is greater than 1.

3. The OPC operation method according to claim 1, wherein the OPC strategies are not identical.

4. The OPC operation method according to claim 1, wherein some of the OPC strategies are identical.

5. The OPC operation method according to claim 1, wherein the OPC strategies are concurrently implemented to correct the mask layout.

6. The OPC operation method according to claim 1, wherein the step of implementing the optimum OPC strategy to correct the mask layout comprises:
    implementing the optimum OPC strategy on the local area pattern to correct the at least one local area pattern; and
    merging the at least one local area pattern which is corrected to the mask layout to correct the mask layout.

7. The OPC operation method according to claim 1, wherein the step of implementing the optimum OPC strategy to correct the mask layout comprises:
    implementing the optimum OPC strategy on the mask layout to correct the mask layout.

8. The OPC operation method according to claim 1, further comprising:
    collecting a defect hotspot analysis result of the at least one local area pattern, the optimum OPC strategy and the mask layout which is corrected; and
    re-training the machine learning model according to the defect hotspot analysis result of the at least one local area pattern, the optimum OPC strategy and the mask layout which is corrected.

9. An optical proximity correction (OPC) operation device, comprising:
    an input unit configured to obtain a mask layout;
    a local area extraction unit configured to extract at least one local area pattern according to at least one defect hotspot if the mask layout contains the at least one defect hotspot;
    a machine learning model configured to analyze the at least one local area pattern to obtain optimum OPC strategies, wherein an optimum OPC strategy among the more than one OPC strategies is determined by using a cost analysis method; and
    a correction unit configured to implement the at least one OPC strategy to correct the mask layout.

10. The OPC operation device according to claim 9, wherein a quantity of the at least one local area pattern extracted from the mask layout by the local area extraction unit is greater than 1.

11. The OPC operation device according to claim 9, wherein the OPC strategies are not identical.

12. The OPC operation device according to claim 9, wherein some of the OPC strategies are identical.

13. The OPC operation device according to claim 9, wherein the OPC strategies are concurrently implemented to correct the mask layout.

14. The OPC operation device according to claim 9, wherein the correction unit implements the optimum OPC strategy on the local area pattern to correct the at least one local area pattern and further merges the at least one local area pattern which is corrected to the mask layout to correct the mask layout.

15. The OPC operation device according to claim 9, wherein the correction unit implements the optimum OPC strategy on the mask layout to correct the mask layout.

16. The OPC operation device according to claim 9, further comprising:
    a re-training unit configured to re-train the machine learning model according to a defect hotspot analysis result of the at least one local area pattern, the optimum OPC strategy and the mask layout which is corrected.

* * * * *